United States Patent [19]

Huang

[11] Patent Number: 4,894,906

[45] Date of Patent: Jan. 23, 1990

[54] SUPERCONDUCTIVE JOINT FOR MULTIFILAMENT SUPERCONDUCTING AND METHOD OF FORMING

[75] Inventor: Yuchi Huang, Madison, Wis.

[73] Assignee: Nicolet Instrument Corporation, Madison, Wis.

[21] Appl. No.: 137,178

[22] Filed: Dec. 23, 1987

[51] Int. Cl.$^4$ .............................................. H01R 4/68
[52] U.S. Cl. ...................................... 29/599; 29/872; 174/94 R; 501/1
[58] Field of Search ................. 29/599, 869, 871, 872; 174/84 C, 94 R; 501/1

[56] References Cited

U.S. PATENT DOCUMENTS

| | | | |
|---|---|---|---|
| 4,584,547 | 4/1986 | Thornton | 335/216 |
| 4,630,881 | 12/1986 | Kumpitsch et al. | 339/176 R |
| 4,631,808 | 12/1986 | Jones | 29/599 |
| 4,733,180 | 3/1988 | Hoenig et al. | 307/306 X |
| 4,797,510 | 1/1989 | Mihelich | 29/599 |

*Primary Examiner*—Timothy V. Eley
*Assistant Examiner*—Taylor J. Ross
*Attorney, Agent, or Firm*—Lathrop & Clark

[57] ABSTRACT

The ends of two composite superconductors (10a and 10b) having many filaments (12) are joined together to form a joint that is durable, superconducting under proper conditions, and has good shunting capacity. The filaments (12) are exposed by removal of the normal conducting matrices (14a and 14b) from the ends of the composite conductors (10a and 10b) to be joined. The superconductive filaments (12) from each of the composite conductors are inserted together into a sleeve (16) of bimetal construction. The inner surface (18) of the sleeve is made of superconducting material and is metallically bonded to the outer surface (20) of the sleeve which is made of normal conducting material. The bimetal sleeve (16) abuts the matrices (14a and 14b) of the composite conductors (10a and 10b) on one end, and the filaments (12) extend beyond the opposing end of the bimetal sleeve (16). The bimetal sleeve (16) is crimped to form a cold weld joint, and then severed in the region of the crimp to form another cold weld joint. A substantial amount of solder (24) is then applied to cover the remaining bimetal sleeve (16), the neighboring matrices (14a and 14b), and the region of the crimp.

24 Claims, 3 Drawing Sheets

1

SUPERCONDUCTIVE JOINT FOR MULTIFILAMENT SUPERCONDUCTING AND METHOD OF FORMING

FIELD OF THE INVENTION

This invention relates generally to methods for forming superconductor joints and particularly to methods for forming superconductive joints between composite superconductors having many superconductive filaments.

BACKGROUND OF THE INVENTION

Wires or cables used as superconductors typically are composed of a composite of multiple superconducting filaments embedded in a comparatively large matrix of material that is a normal conductor. Copper and aluminum are examples of common matrix materials. The matrix acts as a protective shunt for preventing the composite conductor from being damaged on accidentally passing from the superconductive state into the normal (ohmic or resistive) state, as superconductive materials are ordinarily poor conductors under non-superconducting conditions. If a superconducting system lacks a matrix and suddenly becomes non-superconductive, the heat dissipated by the now-resistive "superconductors" burns out the filaments. When the composite superconductor is operating under conditions where it is in the normal state, the matrix carries the electrical current temporarily. Under superconducting conditions, the superconductive filaments conduct the electrical current.

Where it is necessary to splice or connect the ends of two or more of these multifilamentary composite superconductors together, the resultant joints must be both shunted and superconductive. If the joint is not shunted, it has the same potential to burn up as the individual filaments do without a matrix. The joint must be superconductive to maintain the persistent mode along the length of the superconductor since otherwise the joint acts as a resistor in the circuit. Since the current carried by the superconducting filaments is ordinarily quite large, significant energy would be dissipated in a resistive joint, even if the joint were not destroyed.

A superconducting joint must generally withstand exceptionally large mechanical and electrical stresses, particularly where such multifilamentary superconductors are used as coil circuits for the purpose of creating high strength, uniform magnetic fields. To achieve such magnetic fields, the circuits must carry current at a high level of current density, typically 10,000 amperes/cm$^2$ or more. In such high field magnets, the mechanical stress in the wire due to the field increases as the square of the field.

A superconductive joint should thus preferably be mechanically strong and durable, maintain a persistent mode, and have good shunting capacity. The prior art has sought to accomplish these ends by forming joints using a process of either welding or crimping, or a combination of both. In one method, the superconducting filaments are welded to an intermediate foil after stripping the ends of the surrounding matrix. This method, however, is impractical when hundreds or thousands of filaments are to be joined. A second method is to crimp the ends together in a sleeve made of copper. This method of joint formation can be difficult to repeat with high reliability.

In a method disclosed in U.S. Pat. No. 4,631,808 to Jones, one or more superconductive conductors embedded in a resistive matrix are joined by removing the resistive matrix from a length of superconductive composite conductors to form exposed ends of superconductive filaments, and then juxtaposing the exposed filaments in a sleeve of superconducting material and then crimping the sleeve about the exposed filaments. Thermal fusion of the exposed ends of the conductors may then be performed, if necessary. A final step is then taken in which the crimped joint is encapsulated in a conductive material such as indium that has a low melting point but is solid at the cryogenic temperatures employed. The encapsulation is meant to act as a shunt current path and to provide physical strength and rigidity to the structure. The crimped sleeve, which forms the outer surface of the crimped joint, is difficult to solder because it is made from superconducting materials which do not readily bond to either superconducting or normal conducting materials. The result is that bonding may be poor between the sleeve and the encapsulating material, and between the sleeve and the exposed ends of the superconductive filaments, which can result in loss of effectiveness of the connector over prolonged use. The joint may also be susceptible to damage if the system accidentally shifted to normal conduction. The joint is shunted by directing current in the resistive mode from the encapsulating material to the matrix of the two superconductors that are being connected. If the superconductive sleeve is not properly encapsulated by the conductive material, or if the superconductive sleeve extends too far over the matrix, then the joint will be unable to properly shunt the current.

SUMMARY OF THE INVENTION

In accordance with the present invention, the composite superconductors to be joined are stripped of the matrix material at the ends so that the superconductive filaments are left exposed. The filaments of the superconductors to be joined are then properly cleaned and inserted together into one end of a clean bimetal sleeve, the inside surface of the sleeve being composed of a superconducting material similar to the material of the filaments, and the outside surface of the sleeve being composed of a normal conducting material. The filaments are inserted so that the unstripped portions of the composite superconductors abut one end of the sleeve and the filaments are extended beyond the other end of the sleeve. The bimetal sleeve is then crimped about the superconductive filaments, and the sleeve and extending filaments are severed at the pinch-off region. Solder is then used to cover the severed sleeve, the pinch-off region, and the superconductor at the point of entry into the sleeve.

The use of a bimetal sleeve, the inside surface being superconductive and the outside being normally conducting, has a number of advantages over the prior art. Under non-superconducting conditions, the superconducting materials are essentially insulators and, consequently, have a low thermal coefficient of expansion and contraction. Because the normal conductor has a higher thermal contraction coefficient than the superconducting material, a compressive force on the crimped joint is maintained when the joint is cooled to superconductive temperatures. The application of solder covering the sleeve will also apply a certain amount of mechanical stress on the two joined superconductors resulting from the contraction of the solder at superconducting temperatures. In addition, the normal conductor on the bimetal sleeve is readily solderable, and has none of the bonding problems that exist in the prior art. The use of a bimetal sleeve therefore produces a superconducting joint of greater integrity than those known in the prior art.

The present invention also has excellent shunting capacity. Since the normal conductor on the bimetal sleeve is of similar material to the normal material on the matrix of the superconductors to be joined, the sleeve itself acts as a current shunt when superconducting filaments are at their normal state or transition state. The solder on the joint and the adjacent composite superconductors serves as an additional current shunt.

Further objects, features, and advantages of the invention will be apparent from the following detailed description taken in conjunction with the accompanying drawings.

DESCRIPTION OF THE PREFERRED EMBODIMENT

Figure 1:
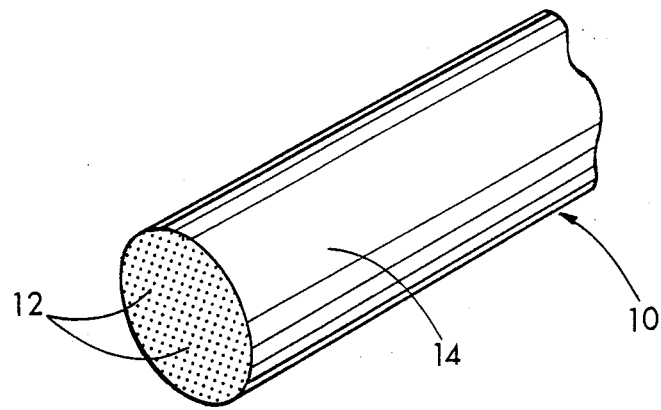
FIG. 1 is a perspective end view of a composite superconductor in which is embedded an array of superconducting filaments.

With reference to the drawings, FIG. 1 shows a composite conductor 10 having a large number of filaments 12 of a superconducting material embedded in a matrix 14 of a normally conducting material. The matrix 14 is preferably composed of a metal such as copper or aluminum that has low electrical resistivity at cryogenic temperatures. For illustrative purposes, the superconducting filaments may be composed of a material such as niobium titanium (NbTi), though any of the superconducting materials would be satisfactory if formed into filaments that are embedded in a normally conducting matrix. The composite conductor 10 may be a commercially available product. Examples of commercially available conductors which are useful in the practice of the present invention are conductors manufactured by the Vacuumschmelze (VAC) of Germany (designated VAC F54), by Intermagnetics General Corporation of Guilderland, N.Y., and by Oxford Superconducting Technology of Carteret, N.J.

Figure 2:
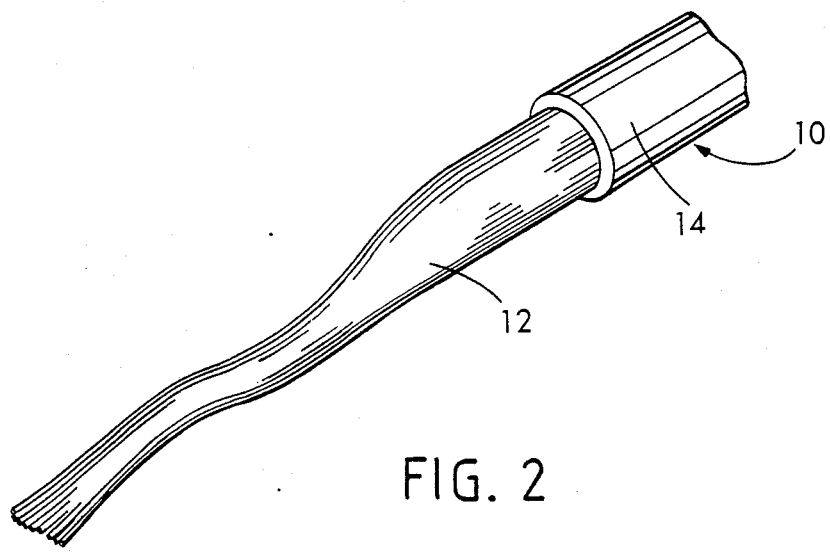
FIG. 2 is a schematic view of a composite conductor end with liberated filaments of superconductor extending therefrom.

The first step of the joint forming method of the present invention is to remove the matrix 14 from the ends of the conductors 10 that are to be connected, exposing the superconductive filaments 12. The matrix 14 is removed by means known in the art, typically by immersing the wire ends in a bath of liquid metal or other selective etchant. FIG. 2 shows one of the wire ends after the matrix 14 has been removed.

Figure 3:
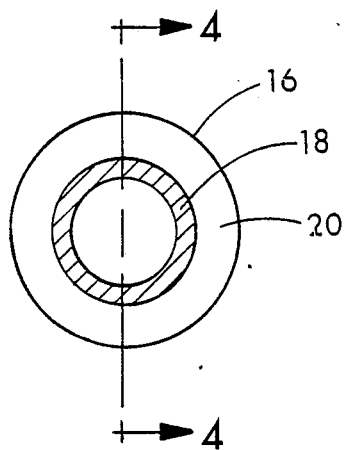
FIG. 3 is an end view of the bimetal sleeve.
Figure 4:
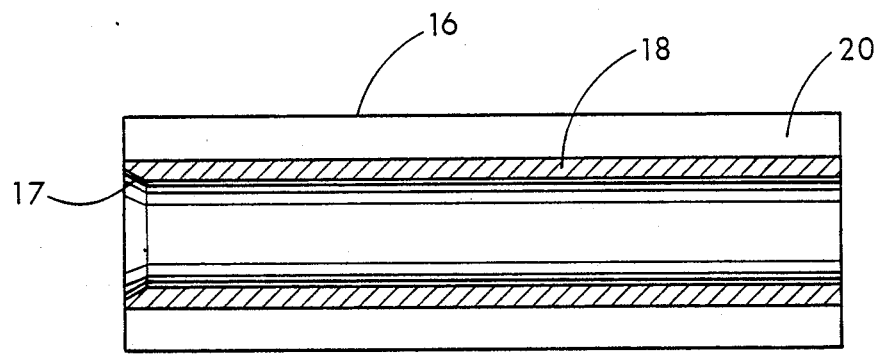
FIG. 4 is a cross-sectional view of the bimetal sleeve along the line 4—4 of FIG. 3.

A bimetal sleeve 16 is constructed by "metallicly bonding" an inner surface 18 made of superconducting material with an outer surface 20 made of normally conducting material. The bimetal sleeve is preferably made by enclosing a large internal core composed of superconducting material with normal conducting metal. The rod of normally conducting metal and the superconducting material are then fused together by drawing and extruding the rod through successively smaller dies, resulting in a "metallic bond." This fusing process is known in the art. A hole is then drilled through the center of the internal superconducting core to produce the resultant bimetal sleeve 16 shown in FIG. 3. As shown in FIG. 4, one end 17 of the bimetal sleeve 16 may be slightly counter-sunk to allow for easy insertion of the superconducting filaments 12 of two conductors 10a and 10b that are to be joined. The superconducting material on the inner surface 18 of the bimetal sleeve 16 is preferably composed of material which is the same as or similar to the material forming the superconducting filaments 12 of the conductors 10a and 10b that are being joined. Similarly, the normal conducting material on the outer surface of the bimetal sleeve 16 is preferably composed of the same material as the matrices 14a and 14b of the conductors 10a and 10b that are being joined.

Figure 5:
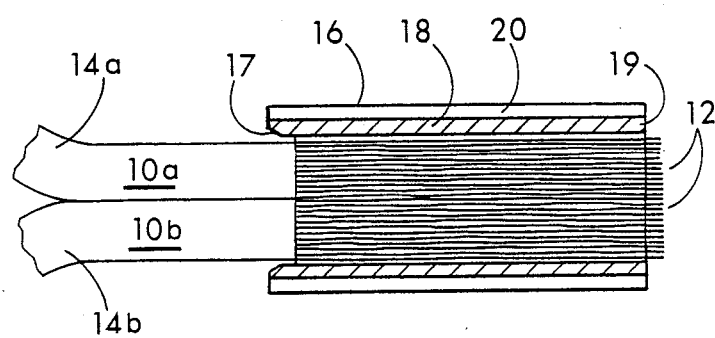
FIG. 5 is a partial cross-sectional view through a connector and filaments inserted therein illustrating the position of the parts prior to crimping of the sleeve.

The remaining steps in the formation of the superconductive joint are preferably performed in a controlled environment of inert gas such as argon with very low moisture content. The superconductive filaments 12 and the bimetal sleeve 16 are properly cleaned. The superconductive filaments 12 of the ends of the conductors 10a and 10b to be connected are inserted into the counter-sunk end 17 of the bimetal sleeve 16. The superconductive filaments 12 are juxtaposed in the bimetal sleeve 16 so that the counter-sunk end 17 of the bimetal sleeve abuts against the matrices 14a and 14b of each of the wires 10a and 10b to be joined. The superconducting filaments 12 are preferably extended beyond the other end 19 of the bimetal sleeve 16. The positions of the conductors 10a and 10b and the bimetal sleeve 16 at this stage are shown in FIG. 5.

Figure 6:
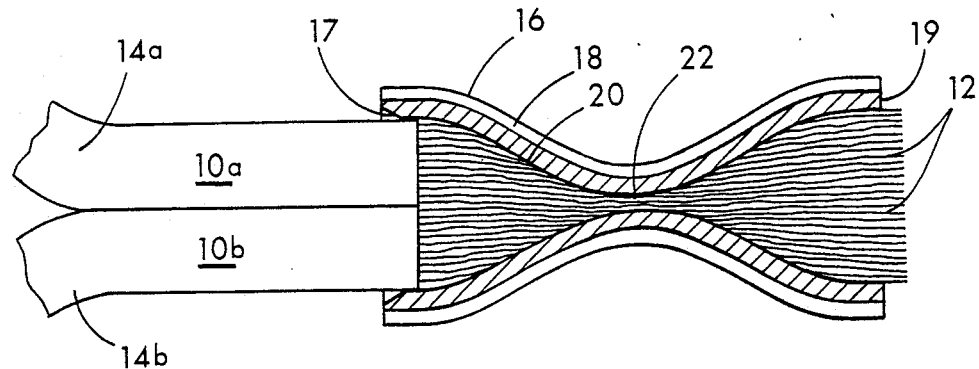
FIG. 6 is a view similar to FIG. 5 after the sleeve has been crimped.
Figure 7:
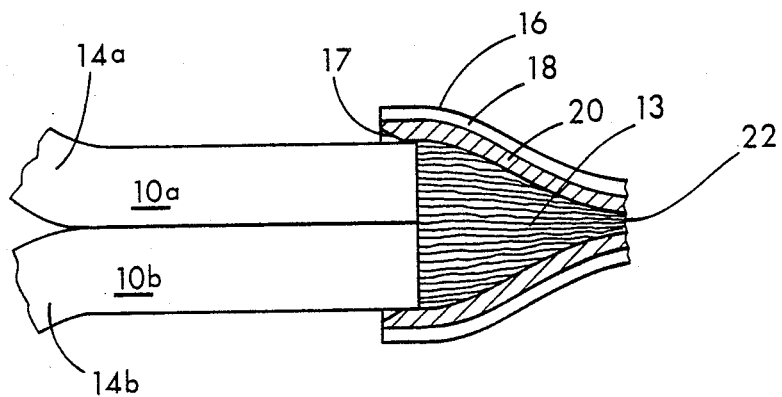
FIG. 7 is a view similar to FIG. 6 illustrating the bimetal sleeve and the superconducting filaments severed at the pinch-off region.
Figure 8:
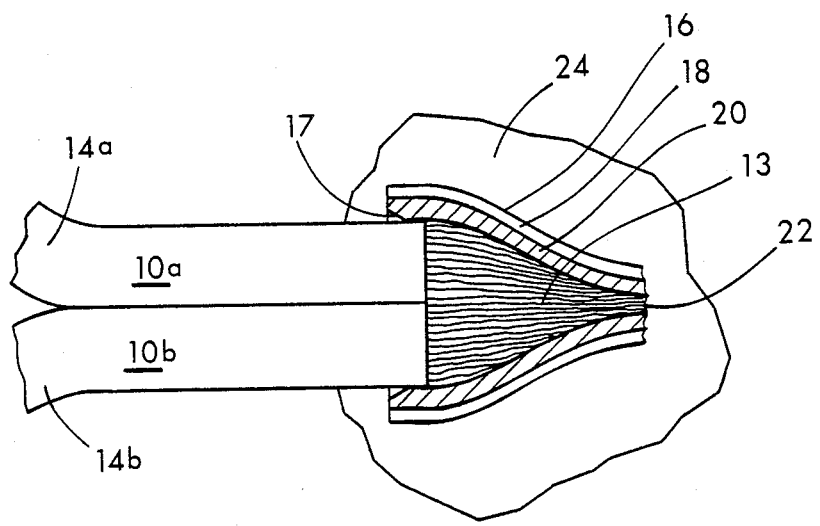
FIG. 8 is a view similar to FIG. 7 showing the completed joint covered with solder.

The bimetal sleeve 16 is then crimped as shown in FIG. 6 about the filaments 12 so as to form a single filamentary bundle 13. Crimping is ideally performed several times along the entire length of the bimetal sleeve. The crimping of the bimetal sleeve 16 forms a cold weld joint and defines a pinch-off region 22. As shown in FIG. 7, the bimetal sleeve 16 and extending filaments 12 are then severed at the pinch-off region 22 forming yet another cold weld joint occurring as a result of the mechanical working during severing. FIG. 8 illustrates a final step in which a substantial amount of solder 24 is used to cover the pinch-off region 22, the remainder of bimetal sleeve 16, and the adjoining matrices 14a and 14b, at the area where the matrices 14a and 14b but the bimetal sleeve.

It is understood that the invention is not confined to the particular construction and arrangement of parts herein illustrated and described, but embraces such modified forms thereof as come within the scope of the following claims.

What is claimed is:

1. A method of forming a joint of at least two superconductive composite conductors in which a plurality of superconductive filaments are embedded in a normal conducting matrix, the method comprising the steps of
(a) removing the normal conducting matrix from along a length of at least two superconductive composite conductors at the ends thereof to expose the superconductive filaments;
(b) inserting the exposed superconductive filaments from both conductors together into a sleeve of bimetal material, the inner surface of the bimetal sleeve being composed of superconducting material, and the outer surface of the bimetal sleeve being composed of normal conducting material;
(c) crimping the sleeve over the superconductive filaments so as to produce a pinch-off region in the sleeve.

2. The method of claim 1 including the step of severing the sleeve at the pinch-off region.

3. The method of claim 1 including during the step of inserting the exposed superconducting filaments, abutting one end of the sleeve against the matrices of the composite superconductors to be joined.

4. The method of claim 1, 2 or 3 further comprising the step of covering with solder the bimetal sleeve, the pinch-off region, and a portion of the composite conductors at and adjacent to the position where the composite conductors meet the bimetal sleeve.

5. The method of claim 1, 2 or 3 wherein the superconducting filaments and the inner surface of the bimetal sleeve are composed of the same material.

6. The method of claim 5 wherein the inner surface of the bimetal sleeve and the superconductive filaments are composed of niobium titanium alloy.

7. The method of claim 1 in which the steps are performed in a controlled inert gas environment.

8. The method of claim 1 wherein the outer surface of the bimetal sleeve is composed of copper.

9. The method of claim 1 wherein the outer surface of the bimetal sleeve is composed of aluminum.

10. A method of forming a joint of at least two superconductive composite conductors in which a plurality of superconductive filaments are embedded in a normal conducting matrix, the method comprising the steps of:
(a) removing the normal conducting matrix from along a length of at least two superconductive composite conductors at the ends thereof to expose the superconductive filaments;
(b) inserting the exposed superconductive filaments from both conductors together into a sleeve of bimetal material, the inner surface of the bimetal sleeve being composed of superconducting material, and the outer surface of the bimetal sleeve being composed of normal conducting material, the normal metal and the superconducting material comprising the sleeve being metallically bonded; and
(c) crimping the sleeve over the superconductive filaments so as to produce a pinch-off region in the sleeve.

11. The method of claim 10 wherein the bimetal sleeve is formed by a process comprising the steps of:
(a) enclosing a large internal core of a superconducting material with a normal conducting metal to form a rod;
(b) drawing and extruding the rod through a series of successively smaller dies; and
(c) drilling a hole through the center of the internal superconducting core of a size that will accommodate the filaments of the two composite superconductors to be joined.

12. The method of claim 10 including the step of severing the sleeve at the pinch-off region.

13. The method of claim 10 including during the step of inserting the exposed superconducting filaments, abutting one end of the sleeve against the matrices of the composite superconductors to be joined.

14. A joint joining two composite superconductive conductors, comprising:
(a) at least two lengths of superconductive conductors having a plurality of superconductive filaments embedded in a normal conducting matrix, the ends of the superconductive conductors being stripped of the normal conducting matrix in the areas of the joint so as to expose the superconductive filaments; and
(b) a bimetal sleeve that is crimped over the exposed superconductive filaments to form a pinch-off region, the inner surface of the bimetal sleeve being composed of superconductive material and the outer surface of the bimetal sleeve being composed of normally conducting material.

15. The joint of claim 14 wherein the bimetal sleeve and superconductive filaments are severed at the pinch-off region.

16. The joint of claim 15 wherein an end of the bimetal sleeve abuts the matrices of the composite superconductors.

17. The joint of claim 14, 15 or 16 further including solder that covers the bimetal sleeve, the pinch-off region, and a portion of superconductive conductors at and adjacent to the position where the superconductive conductors meet the bimetal sleeve.

18. The joint of claim 14, 15 or 16 wherein the superconducting filaments and the inner surface of the bimetal sleeve are composed of the same material.

19. The joint of claim 14 wherein the inner surface of the bimetal sleeve is composed of niobium titanium alloy.

20. The joint of claim 12 wherein the outer surface of the bimetal sleeve is composed of copper.

21. The joint of claim 14 wherein the outer surface of the bimetal sleeve is composed of aluminum.

22. A joint joining two composite superconductive conductors, comprising:
(a) at least two lengths of superconductive conductors having a plurality of superconductive filaments embedded in a normal conducting matrix, the ends of the superconductive conductors being stripped of the normal conducting matrix in the areas of the joint so as to expose the superconductive filaments; and
(b) a bimetal sleeve that is crimped over the exposed superconductive filaments to form a pinch-off region, the inner surface of the bimetal sleeve being composed of superconducting material and the outer surface of the bimetal sleeve being composed of normally conducting material, the normal metal and the superconducting material comprising the sleeve being metallicaly bonded.

23. The joint of claim 22 wherein the bimetal sleeve and superconductive filaments are severed at the pinch-off region.

24. The joint of claim 22 wherein an end of the bimetal sleeve abuts the matrices of the composite superconductors.

* * * * *